(12) United States Patent
Sul et al.

(10) Patent No.: US 11,901,846 B2
(45) Date of Patent: Feb. 13, 2024

(54) MOTOR EMULATOR

(71) Applicant: PLECKO CO., LTD., Seoul (KR)

(72) Inventors: Seung-Ki Sul, Seoul (KR); Yong-Cheol Kwon, Seoul (KR); Yoon-Ro Lee, Anyang-si (KR)

(73) Assignee: PLECKO CO., LTD., Seoul (KR)

( * ) Notice: Subject to any disclaimer, the term of this patent is extended or adjusted under 35 U.S.C. 154(b) by 850 days.

(21) Appl. No.: 16/964,371

(22) PCT Filed: Oct. 15, 2018

(86) PCT No.: PCT/KR2018/012093
§ 371 (c)(1),
(2) Date: Jul. 23, 2020

(87) PCT Pub. No.: WO2019/146878
PCT Pub. Date: Aug. 1, 2019

(65) Prior Publication Data
US 2021/0036646 A1 Feb. 4, 2021

(30) Foreign Application Priority Data

Jan. 23, 2018 (KR) .................. 10-2018-0008446
Jan. 23, 2018 (KR) .................. 10-2018-0092939

(51) Int. Cl.
*H02P 27/06* (2006.01)
*G01R 19/165* (2006.01)
(Continued)

(52) U.S. Cl.
CPC ........ *H02P 27/06* (2013.01); *G01R 19/16538* (2013.01); *G01R 31/2829* (2013.01);
(Continued)

(58) Field of Classification Search
CPC . H02P 27/06; H02P 6/34; H02P 21/50; G01R 19/16538; G01R 31/2829;
(Continued)

(56) References Cited

U.S. PATENT DOCUMENTS

2008/0312855 A1* 12/2008 Monti ................ G01R 31/2848
702/64
2012/0105072 A1 5/2012 Peterson
(Continued)

FOREIGN PATENT DOCUMENTS

CN 203984224 U * 12/2014
JP 2010-172187 A 8/2010
(Continued)

OTHER PUBLICATIONS

Amitkumar, K.S. et al., "A Versatile Power-Hardware-in-the-loop Based Emulator for Rapid Testing of Electric Drives," 2017 IEEE Energy Conversion Congress and Exposition (ECCE), Oct. 2017, pp. 5468-5474.
(Continued)

*Primary Examiner* — Thomas C Lee
*Assistant Examiner* — Charles Cai
(74) *Attorney, Agent, or Firm* — Fenwick & West LLP

(57) ABSTRACT

Embodiments relate to a motor simulator for an inverter under test (IUT), the motor simulator comprising: a voltage follower inverter for at least partially cancelling an output voltage of the IUT; and an output current control unit for controlling an output current of the IUT on the basis of an estimated current of a simulation target motor.

9 Claims, 16 Drawing Sheets

(51) Int. Cl.
  *G01R 31/28* (2006.01)
  *G01R 31/42* (2006.01)
  *G05B 17/02* (2006.01)
  *H02M 7/5387* (2007.01)
  *G01R 31/3183* (2006.01)

(52) U.S. Cl.
  CPC ..... *G01R 31/318307* (2013.01); *G01R 31/42* (2013.01); *G05B 17/02* (2013.01); *H02M 7/5387* (2013.01)

(58) Field of Classification Search
  CPC ............ G01R 31/318307; G01R 31/42; G05B 17/02; H02M 7/5387; H02M 1/0009; H02M 7/49; H02M 7/53871
  See application file for complete search history.

(56) References Cited

U.S. PATENT DOCUMENTS

2017/0047880 A1* 2/2017 Holthaus ................. H02P 27/08
2019/0199238 A1* 6/2019 Norimatsu .............. H02M 3/01

FOREIGN PATENT DOCUMENTS

JP    2011-101548 A    5/2011
JP    2011-217507 A    10/2011

OTHER PUBLICATIONS

Srinivasa Rao, Y. et al., "Real-Time Electrical Load Emulator Using Optimal Feedback Control Technique," IEEE Transactions on Industrial Electronics, vol. 57, Iss. 4, Apr. 2010, pp. 1217-1225.
Liebig et al., "E-Motor Emulator—Testing Power Electronics without Motor," EVS30 International Battery, Hybrid and Fuel Cell Electric Vehicle Symposium, Oct. 2017, pp. 1-7.
European Patent Office, Extended European Search Report and Opinion, EP Patent Application No. 18902599.2, dated Nov. 10, 2021, nine pages.
Korean Intellectual Property Office, Office Action, KR Patent Application No. 10-2018-0092939, dated Sep. 16, 2021, eight pages.
Schmitt, A. et al., "Power Hardware-in-the-Loop Emulation of permanent Magnet Synchronous Machines with Nonlinear Magnetics—Concept & Verification," PCIM Europe, May 2016, pp. 393-400.
Uebener, S. et al., "Application of an e-machine emulator for power converter tests in the development of electric drives," EEVC European Electric Vehicle Congress, Nov. 2012, pp. 1-9.

* cited by examiner

MOTOR EMULATOR

TECHNICAL FIELD

This disclosure relates to a motor emulator, and more particularly, to a motor emulator including an inverter for canceling an output voltage of a motor driving inverter and a circuit for synthesizing a current of an emulation target motor.

BACKGROUND ART

A real-time motor emulator is a device that is connected to a motor driving inverter (or, an Inverter Under Test: IUT) to output a current from an inverter like an actual AC motor. FIG. 1 shows a conventional motor emulator. The motor emulator of FIG. 1 is disclosed in Patent Literature 1 (U.S. Pat. No. 8,587,322 B2) and is designed to boost a primary DC voltage and output to a secondary side. In this structure, potentials of a neutral point of the primary voltage and a neutral point of the secondary voltage may be the same, and as a result, it is possible to obtain a wider voltage modulating area of the motor emulator. However, when boosting the secondary DC voltage to emulate a high-speed operation area of the motor, the secondary voltage may be increased excessively so that the required voltage rating of semiconductor devices used in the motor emulator becomes very large.

The current emulated by the motor emulator may be divided into an operating frequency band current of the motor and a switching frequency band current. The fundamental wave electric angle frequency of the emulation target motor is usually up to about 1 kHz, but 5th and 7th harmonic currents may also affect the control. Thus, for accurate emulation of the control performance, it is necessary to emulate a current in the frequency band of 0 Hz to 7 kHz.

For accurate current emulation including switching bands, there are following technical limitations.

The motor emulator must have a sufficiently high switching frequency to synthesize a current in the switching frequency band (typically 5 to 10 kHz) of the IUT.

In order to synthesize a harmonic current by the spatial harmonics of an actual motor flux and a switching frequency current of the IUT, an appropriate circuit method (Topology) and high-performance control technique must be used.

However, in the existing motor emulator, the switching frequency is relatively low, around 20 kHz, and due to the limitations of the circuit method and the control technique, the practical current emulation band has been limited to about 2 kHz. Therefore, the use of the existing motor emulator is mainly limited to the durability verification of the IUT, and there are limitations in emulating a transient response of the harmonic current and control of the motor.

The limitation of the switching frequency of 20 kHz has been overcome by recently developing a SiC (Silicon Carbide) device. If a high-voltage, high-current SiC device capable of high-speed switching is applied to the motor emulator, the switching frequency may be increased to 100 kHz or above depending on heat dissipation conditions.

However, even though the switching element is changed, the technical problem of the existing motor emulator still exists. For the high-frequency current emulation performance of the motor emulator, the inductance of the motor emulator is preferably similar to the inductance of the emulation target motor (0.9 pu to 1.1 pu), but the magnitude of the voltage instruction synthesized by the motor emulator is increased as the inductance grows bigger. Therefore, in order to emulate the medium-speed and high-speed operation conditions, a DC terminal voltage must be further increased through the boosting circuit. However, as described above, the magnitude of the DC terminal voltage is limited by the voltage rating of the devices. If the DC terminal voltage is limited by the voltage rating of the devices, it is impossible to emulate all the operating conditions of the emulation target motor.

If the inductance of the motor emulator is small (0.1 pu to 0.3 pu), the voltage shortage problem is solved, but the problem as shown in FIG. 2 occurs. FIG. 2 shows a current of the motor emulator and an actual motor current when the output voltage of the IUT is switched (On-Off). Referring to FIG. 2, a time delay of 2 samples occurs due to digital signal processing until the motor emulator synthesizes voltage, during which a large current ripple is generated. Since the size of the ripple is inversely proportional to the magnitude of the inductance, as the inductance of the motor emulator is smaller, the current pulsation caused by the delay increases. For this reason, the inductance of the motor emulator cannot be reduced by using the existing circuit method, which limits the emulated operation speed.

DISCLOSURE

Technical Problem

In order to overcome the above problems, the present disclosure proposes a method to reduce a current pulsation generated by digital control without causing a DC terminal voltage shortage when emulating medium-speed and high-speed operations of a motor.

The technical object of the present disclosure is not limited to the above, and another technical object not mentioned herein will be clearly understood by those skilled in the art from the following description.

Technical Solution

In one general aspect, there is provided a motor emulator for a motor driving inverter (or, an Inverter Under Test, IUT), comprising: a voltage following inverter configured to cancel the output voltage of the IUT at least partially; and an output current control unit configured to control an output current of the IUT based on the output voltage of the IUT and an estimated current of the emulated target motor.

In a preferred embodiment, the voltage following inverter may include a DC terminal voltage source; a first switching unit connected to the DC terminal voltage source in parallel and electrically connected to an output terminal of the IUT; and a first switching control unit configured to control switching of the first switching unit based on the output voltage of the IUT and a predetermined threshold voltage.

In a preferred embodiment, the first switching unit may include an upper-phase switch and a lower-phase switch connected in series, and the first switching control unit may switch the upper-phase switch and the lower-phase switch by comparing the output voltage of the IUT with the predetermined threshold voltage.

In a preferred embodiment, the first switching control unit may be made of an electronic circuit that receives the output voltage of the IUT and the predetermined threshold voltage. Here, the electronic circuit may be an analog circuit.

In a preferred embodiment, the output current control unit may include a switching circuit electrically connected to an output terminal of the IUT; and a second switching control unit configured to estimate a current of the emulated target motor based on the output voltage of the IUT and a characteristic of the emulated target motor and control switching of the switching circuit based on the estimated current.

In a preferred embodiment, the switching circuit may be made of a SiC MOSFET.

In a preferred embodiment, the switching circuit may be made of any one of a full bridge circuit, a half bridge circuit and a linear power amplifier circuit.

In a preferred embodiment, the characteristic of the emulated target motor may include at least one of magnetic flux interlinkage, magnetic saturation, and spatial harmonics of the motor.

In a preferred embodiment, the motor emulator may further comprise an independent DC voltage source configured to provide a DC voltage to the switching circuit, and the independent DC voltage sources of different phases may be insulated from each other.

In a preferred embodiment, the motor emulator may further comprise a filtering unit disposed between an output terminal of the IUT and the voltage following inverter, and the filtering unit may include at least one of a single-phase inductor, a three-phase inductor and a zero sequence filter.

Advantageous Effects

By means of the motor emulator according to an embodiment of the present disclosure, it is possible to obtain a wider voltage modulation area than the conventional one, increase a emulated operation speed and allow precise emulation up to a current in a higher switching frequency region by using the same DC terminal voltage.

The motor emulator implemented as above may accurately emulate a normal state and a transient state even under operating conditions that are dangerous or difficult in experimentally implementing, including all possible operating conditions of the motor, and thus it is possible to use the motor emulator for motor control performance and safety verification using an IUT.

The effects of the present disclosure are not limited to the above, and other effects not mentioned herein will be clearly understood by those skilled in the art from the claims.

BEST MODE

Figure 1:
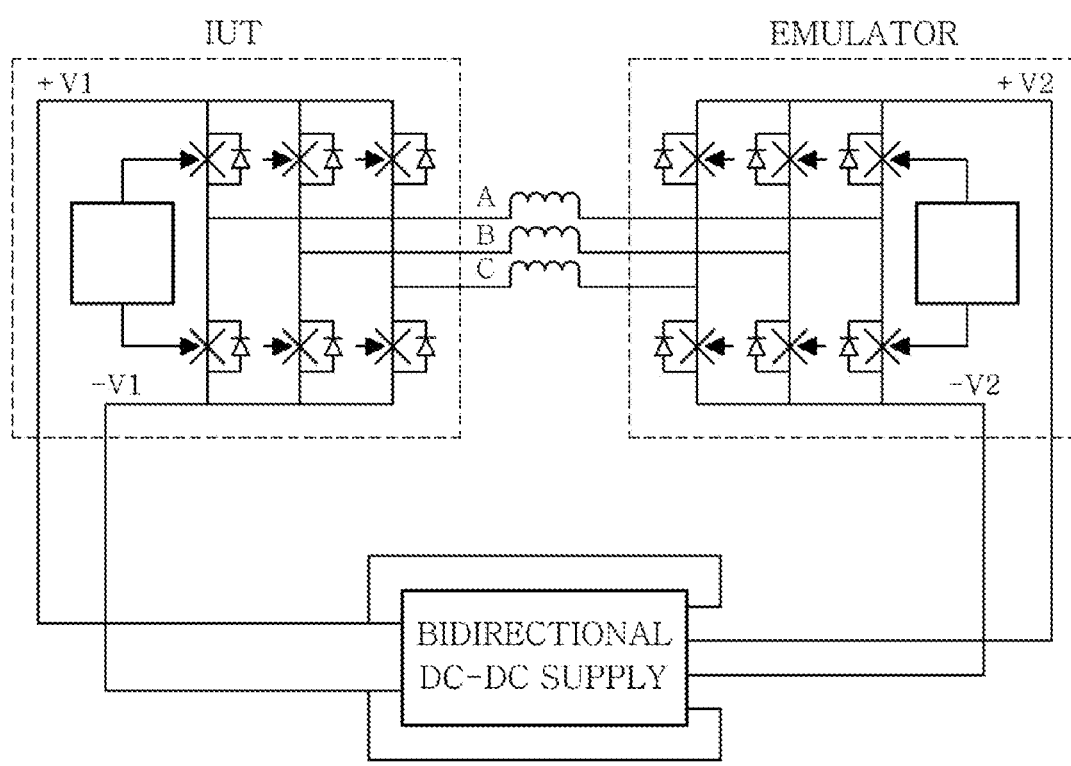
FIG. 1 shows a conventional motor emulator.
Figure 2:
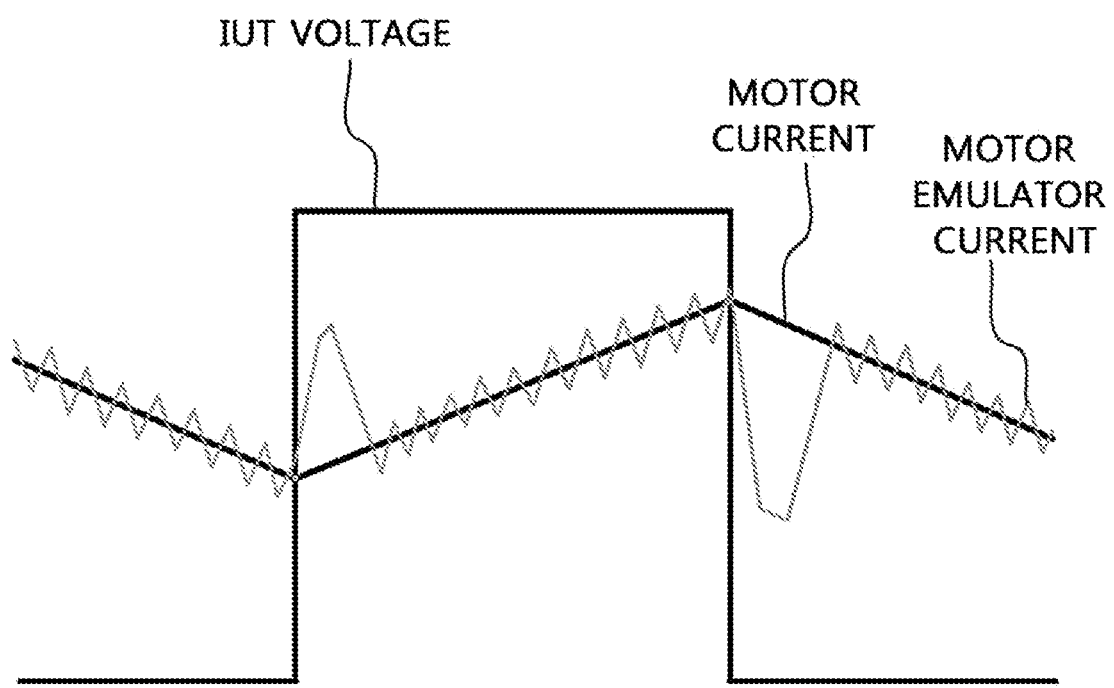
FIG. 2 shows a current of the conventional motor emulator and an actual motor current when an output voltage of an IUT is switched (On-Off).

It should be noted that technical terms used in this specification are only used to describe specific embodiments and are not intended to limit the scope of the technology disclosed in this specification. The expressions "include", "have" and the like used in this specification are intended to indicate the presence of features, numbers, steps, actions, components, parts, or combinations thereof described in the specification, and should not be understood to exclude the presence or possibility of addition of one or more other features, numbers, steps, actions, components, parts, or combinations thereof in advance.

Embodiments described in this specification may be entirely hardware, partly hardware and partly software, or entirely software. In this specification, the term "unit", "module", "device" or "system" refers to hardware, a combination of hardware and software, or a computer-related entity such as software. For example, in this specification, the "unit", "module", "device" or "system" may be a process in execution, a processor, an object, an executable, a thread of execution, a program, and/or a computer, but is not limited thereto. For example, both an application executing on a computer and a computer may correspond to the "unit", "module", "device" or "system" of this specification.

The present disclosure will be described below with reference to the accompanying drawings that show, by way of illustration, specific embodiments in which the present disclosure may be implemented. The embodiments are described fully to enable those skilled in the art to implement the present disclosure. It should be understood that the various embodiments of the present disclosure are different from each other but need not be mutually exclusive. For example, certain shapes, structures and characteristics of one embodiment described herein may be realized in other embodiments without departing from the scope of the present disclosure.

In addition, it should be understood that the locations or arrangements of individual components in each disclosed embodiment may be changed without departing from the scope of the present disclosure. Accordingly, the following detailed description is not to limit the scope of the present disclosure, and if properly described, the scope of the present disclosure is defined only by the appended claims along with the full range of equivalents to which the claims are entitled. Like reference numerals in the drawings refer to the same or similar functions throughout the several aspects.

Figure 3:
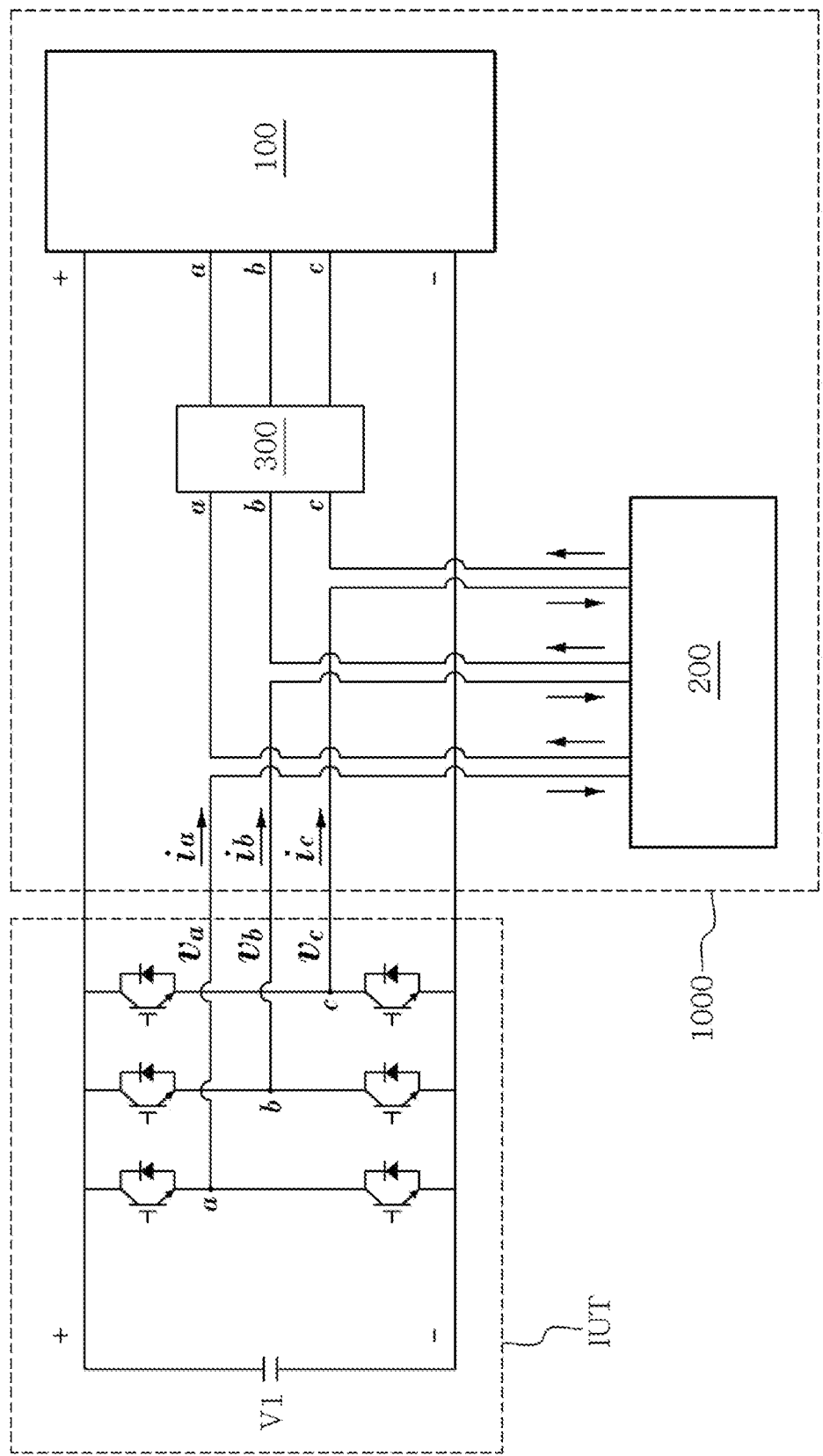
FIG. 3 is a block diagram showing a motor emulator for a motor driving inverter (or, an Inverter Under Test, IUT) according to an embodiment of the present disclosure.

FIG. 3 is a block diagram showing a motor emulator for a motor driving inverter (or, an Inverter Under Test, IUT) according to an embodiment of the present disclosure. Referring to FIG. 1, a motor emulator 1000 may include a voltage following inverter 100 for canceling output voltages $v_a$, $v_b$, $v_c$ of the IUT at least partially, and an output current control unit 200 for controlling output currents $i_a$, $i_b$, $i_c$ of the IUT based on the output voltages $v_a$, $v_b$, $v_c$ of the IUT and an estimated current of an emulated target motor.

FIG. 3 shows a three-phase motor and a three-phase inverter, but the motor emulator of the present disclosure is not limited to the three-phase circuit, and may also be applied to a single-phase or another multi-phase (5-phase, 6-phase, 7-phase, or the like) circuit.

Figure 4:
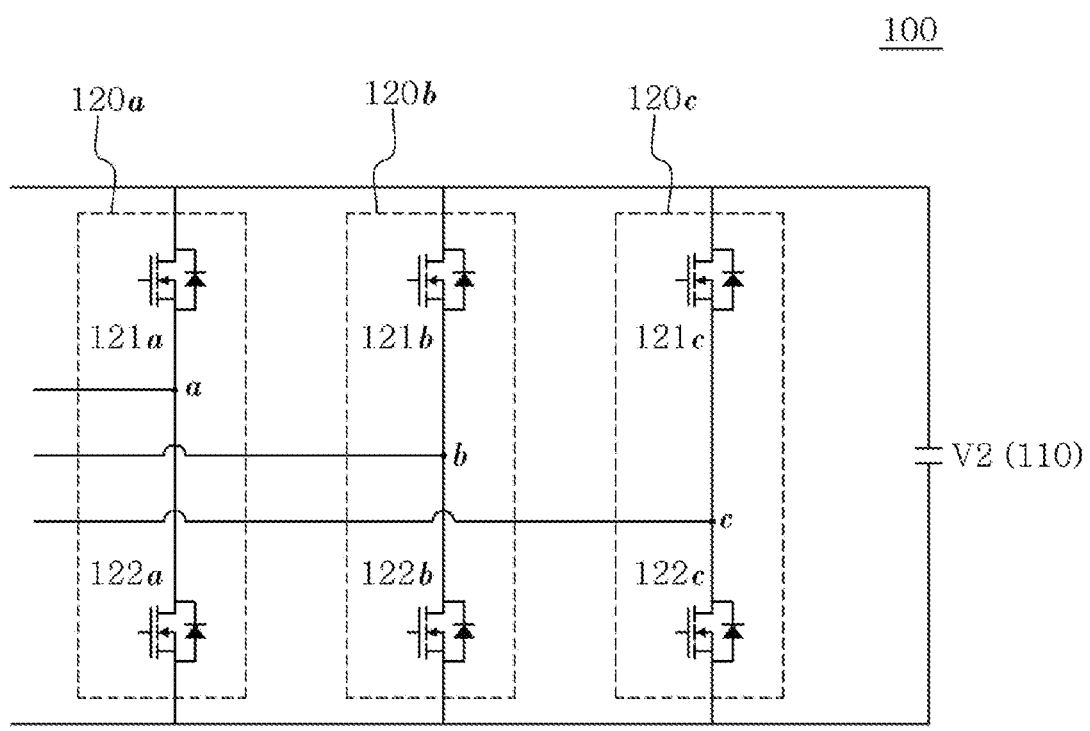
FIG. 4 shows a voltage following inverter according to an embodiment of the present disclosure.
Figure 5:
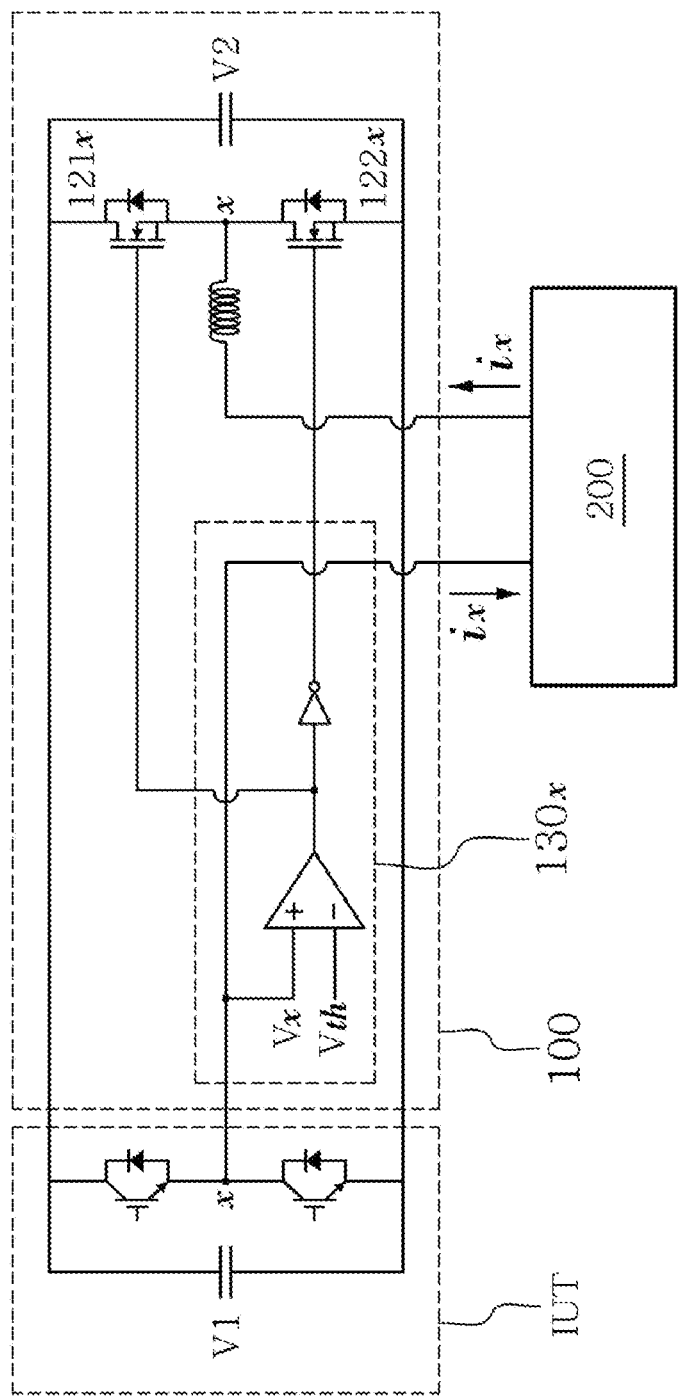
FIG. 5 shows an example of generating a gating signal at any one phase (x) of the voltage following inverter.

FIGS. 4 and 5 show the voltage following inverter 100 according to an embodiment of the present disclosure.

Specifically, FIG. 4 shows a state where an output terminal of each phase is connected, and FIG. 5 is a detailed circuit diagram showing one phase. In FIG. 5, x may be any one of a, b and c phases.

The voltage following inverter 100 may cancel the output voltage of the IUT at least partially.

In an embodiment, the voltage following inverter 100 includes a DC terminal voltage source 110 (v2), a first switching unit 120 (120$_a$, 120$_b$, 120$_c$) connected to the DC terminal voltage source 110 in parallel and electrically connected to an output terminal of the IUT, and a first switching control unit 130 for controlling switching of the switching unit 120 based on the output voltage of the IUT and a predetermined threshold voltage.

Referring to FIG. 4, the DC terminal voltage source 110 shows both ends with the DC terminal voltage source v1 of the IUT. The first switching unit 120 may include switch pairs 120$_a$, 120$_b$, 120$_c$, each of which has two switches for each phase. In this specification, two switches of each switch pair are expressed as upper-phase switches 121$_a$, 121$_b$, 121$_c$ and lower-phase switches 122$_a$, 122$_b$, 122$_c$.

As shown in FIG. 4, the switch pairs 120$_a$, 120$_b$, 120$_c$ of every phase may be connected in parallel, and the upper-phase switch and the lower-phase switch may be connected in series. The output terminal of each phase of the IUT may be connected between the upper-phase switch and the lower-phase switch.

The first switching control unit 130 may compare the output voltage $v_x$ of the IUT with the predetermined threshold voltage $v_{th}$ and switch the upper-phase switch 121$_x$ and the lower-phase switch 122$_x$.

Referring to FIG. 5, if the X-phase output voltage of the IUT exceeds an arbitrary threshold voltage $v_{th}$ set between 0 and v1, the upper-phase switch 121$_x$ of the switch pair is turned on and the lower-phase switch 122$_x$ is turned off. Conversely, if the X-phase output voltage of the IUT is less than $v_{th}$, the upper-phase switch 121$_x$ is turned off and the lower-phase switch 122$_x$ is turned on. At this time, since the voltage following inverter 100 and the IUT share a DC terminal (if being switched at the same time), the voltage following inverter may at least partially offset the output voltage of the IUT.

In a preferred embodiment, the voltage following inverter 100 may operate to cancel all output voltages of the IUT, but the present disclosure is not limited thereto, and the voltage following inverter 100 may operate to offset the output voltage of the IUT only at a certain ratio. This ratio may be determined according to the operating characteristics of the output current control unit 200. For example, the voltage following inverter 100 may cancel 80% of the output voltage of the IUT, and the remaining 20% may be offset by the operation of the output current control unit 200.

As shown in FIG. 5, in an embodiment, the first switching control unit 130 may be configured using an analog circuit, but the present disclosure is not limited thereto. However, in the performance of the motor emulator, it is important to minimize a delay time that occurs until a switching signal is transmitted to the voltage following inverter 100. Therefore, it is desirable that the switching signal of the voltage following inverter 100 is transmitted through an analog circuit without digital delay, without going through the processing of CPU or DSP.

Figure 8A:
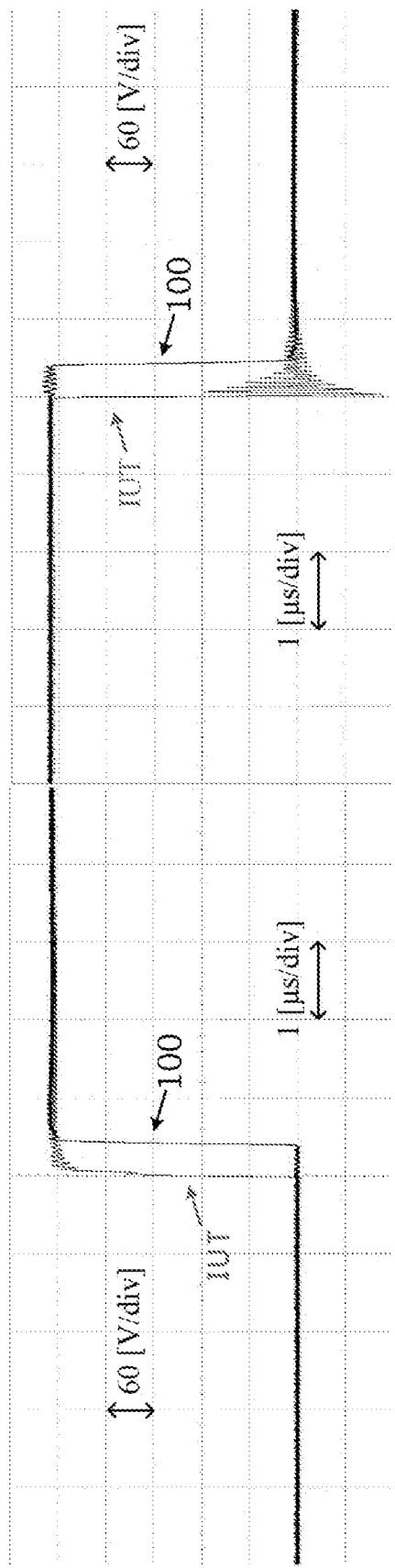
FIGS. 8A and 8B show switching characteristics of the voltage following inverter and the IUT according to an embodiment of the present disclosure.
Figure 8B:
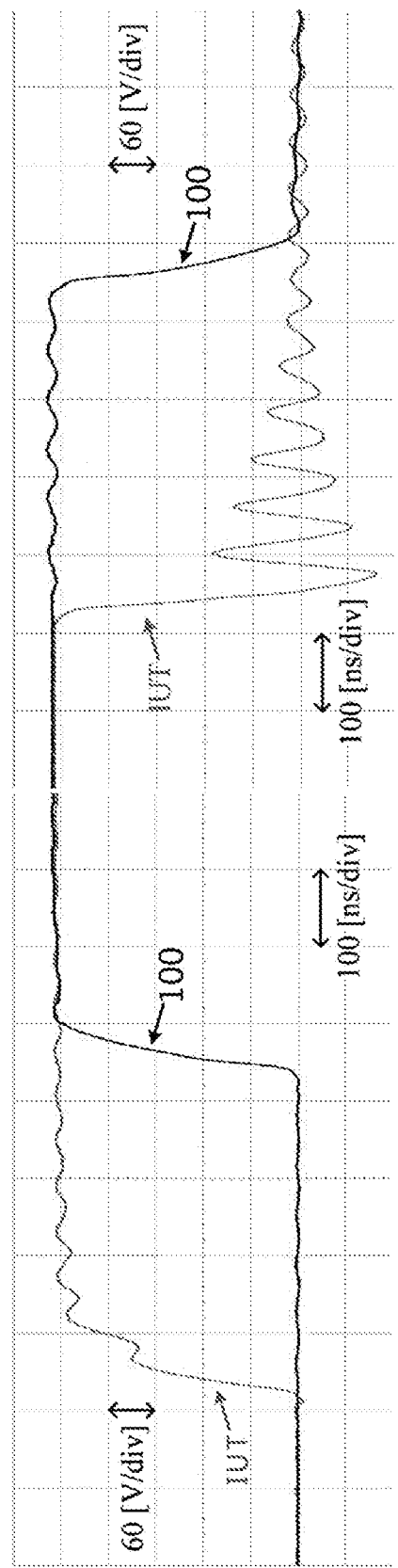

FIGS. 8A and 8B show switching characteristics of the voltage following inverter 100 and the IUT according to an embodiment of the present disclosure. In FIG. 8A, the DC terminal voltage of the IUT and the voltage following inverter 100 is 310 V, and FIG. 8B is a diagram where the time axis of FIG. 8A is magnified 10 times.

Referring to FIGS. 8A and 8B, the voltage following inverter 100 follows the switching of the IUT within 400 ns and completely cancels the output voltage of the IUT. Therefore, if the voltage following inverter 100 operates normally, it may be confirmed that the effect of the output current of the IUT is negligible even though the IUT synthesizes any voltage.

As described above, if the voltage following inverter 100 completely cancels the voltage of the IUT, the output current of the IUT may be determined by the voltage synthesized by the output current control unit 200.

Figure 6:
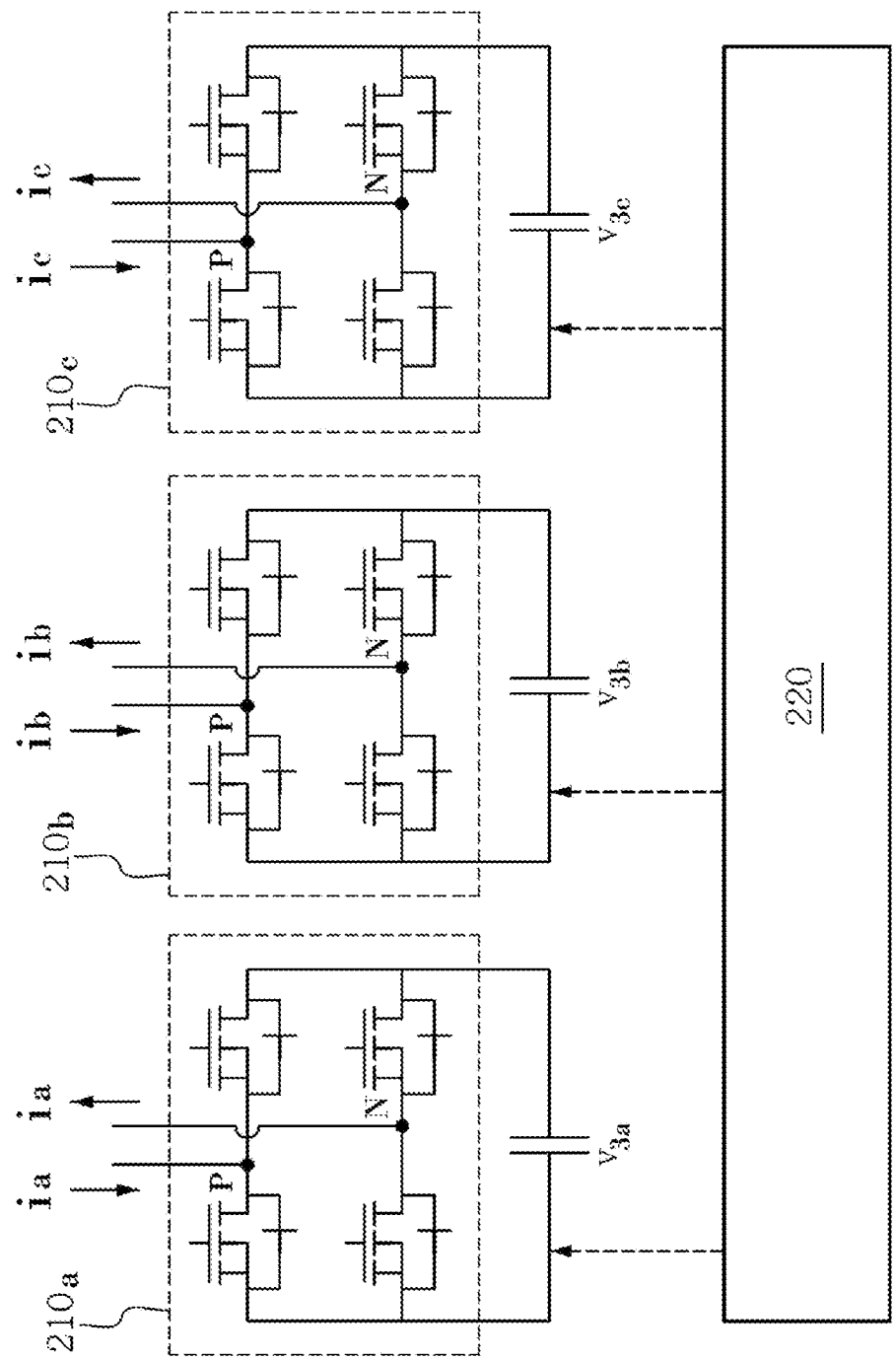
FIG. 6 is a detailed circuit diagram showing an output current control unit according to an embodiment of the present disclosure.

FIG. 6 is a detailed circuit diagram showing the output current control unit 200 according to an embodiment of the present disclosure. The output current control unit 200 may control the output current of the IUT based on the output voltage of the IUT and the estimated current of the emulation target motor by synthesizing a current of the emulation target motor.

Referring to FIG. 6, the output current control unit 200 may include a switching circuit 210 (210a, 210b, 210c) electrically connected to the output terminal of the IUT, and a second switching control unit 220 for estimating the current of the emulated target motor based on the output voltage of the IUT and the characteristics of the emulation target motor and controlling the switching of the switching circuit based on the estimated current and an actual measured current.

In FIG. 6, the switching circuit 210 is shown as a full bridge circuit, but this is only an example of various embodiments of the present disclosure, and the switching circuit 210 may employ various circuits such as a half bridge circuit or a linear power amplifier circuit. Hereinafter, the switching circuit 210 will be described based on a case where it is made of a full bridge circuit.

In an embodiment of the present disclosure, the switching circuit 210 may be made of a SiC MOSFET. If the switching circuit 210 is operated with a switching frequency of 100 kHz, which is ten times of the IUT switching frequency, the output current control unit 200 may synthesize up to a current of 10 kHz IUT switching frequency band. In addition, in the circuit mode of the motor emulator 1000, the voltage applied to an actual load is identical to that of a general three-level converter, so the switching current ripple by the motor emulator is also very small. In addition, the circuit method of the motor emulator 1000 has a voltage modulation area of about 2 to 3 times compared to a general three-phase converter using the same DC terminal power source, so the motor may be simulated with a much wider speed range than the existing circuit method.

In an embodiment of the present disclosure, the second switching control unit 220 may estimate a current of the emulated target motor based on the output voltage of the switching circuit 210 and the IUT and a characteristic of the emulation target motor, and control the switching of the switching circuit based on the estimated current and an actually measured current. Here, the characteristic of the emulated target motor may include a flux linkage reference table (or, a Look-Up Table: LUT). The LUT may include the magnetic properties of the motor, such as magnetic saturation and spatial harmonics of the motor.

For example, the second switching control unit 220 may estimate the current and torque of the motor by using the measured output voltage of the IUT as a state observer input of the motor and applying the same to the LUT. In addition, the second switching control unit 220 may control the output current so that the actual IUT current is equal to the current estimated by the motor model. In addition, the second switching control unit 220 may estimate the speed and position of the motor determined by inertia, friction coefficient, torsion coefficient, or the like by using the torque and load torque of a virtual motor.

Referring to FIG. 6, the output current control unit 200 may include an independent DC voltage source 230 ($v_{3a}$, $v_{3b}$, $v_{3c}$) for providing a DC voltage to each switching circuit $210_a$, $210_b$, $210_c$. Here, the independent DC voltage sources 230 ($v_{3a}$, $v_{3b}$, $v_{3c}$) are insulated from each other.

Figure 7:
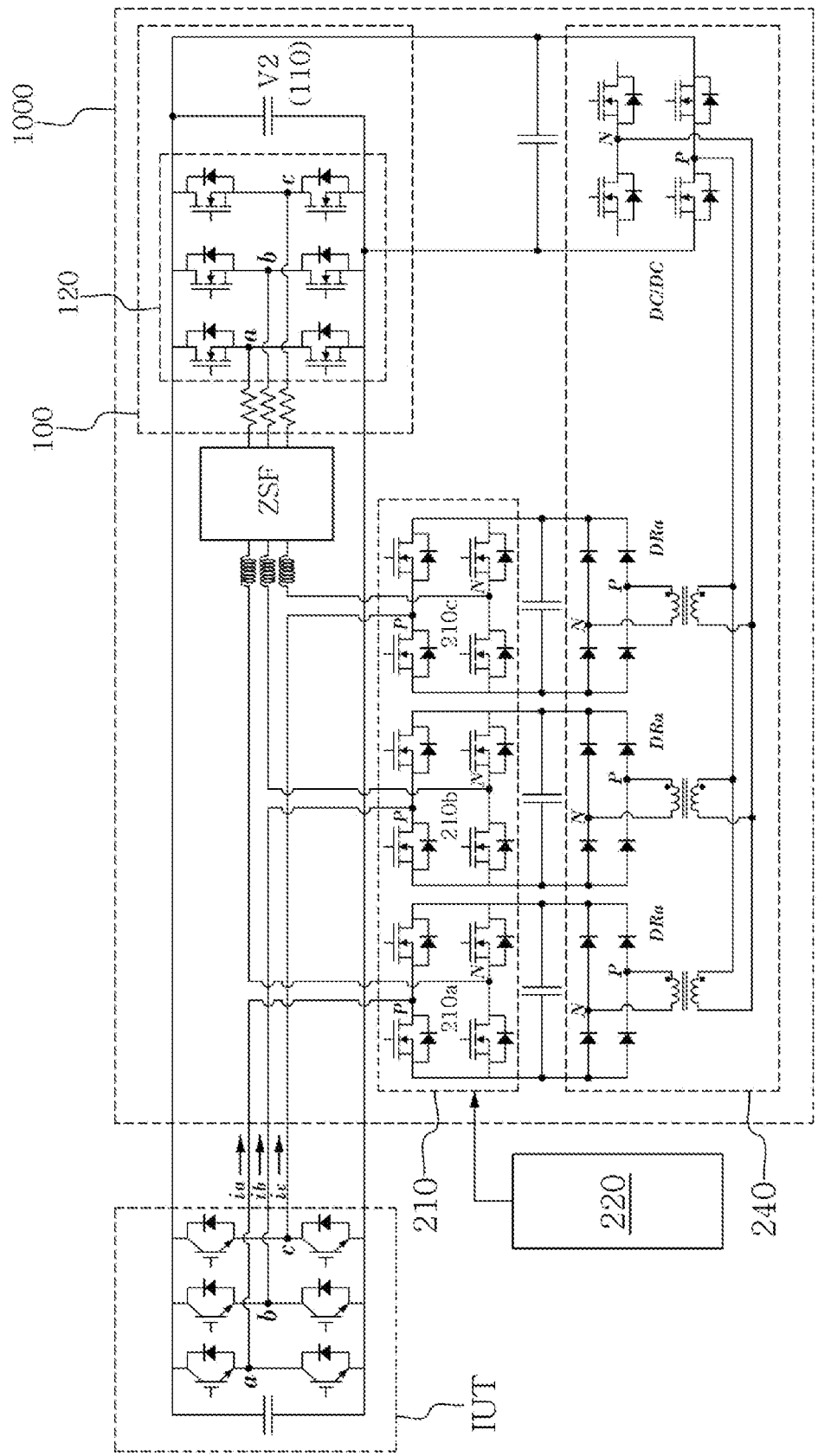
FIG. 7 is a brief circuit diagram showing the motor emulator according to an embodiment of the present disclosure.

FIG. 7 is a brief circuit diagram showing the motor emulator 1000 according to an embodiment of the present disclosure. Referring to FIG. 7, it is shown that the independent DC voltage sources $v_{3a}$, $v_{3b}$, $v_{3c}$ are implemented with a DC/DC converter using a high-frequency transformer.

The motor emulator 1000 seen from the output terminal of the switching circuit 210 has a difference between the output voltages of the IUT and the voltage following inverter 100, namely voltages applied to the filter inductance and the line resistance. However, if the voltage following inverter 100 follows the IUT quite well, the difference between the two output voltages will be very small.

Therefore, the effective power that the switching circuit 210 consumes from the motor emulator 1000 is very small. Thus, the effective power supplied by the independent DC voltage source to the output current control unit is only a few % of the motor power capacity emulated by the motor emulator. In addition, since the DC terminal capacitor C of the switching circuit absorbs an ineffective power generated, the DC/DC converter only needs to supply the effective power generated by the loss of the switching circuit and the difference in voltage, caused by switching.

Therefore, the input/output power of the DC/DC converter is less than a few % of the power capacity of the motor emulator, and since there is no power regenerated through the DC/DC converter, the DC/DC converter of the motor emulator may be implemented to use a one-way power supply method.

However, the converter type shown in FIG. 7 is merely exemplary, and various embodiments capable of stably obtaining three insulated voltage sources may be included herein. That is, in the embodiments of the present disclosure, the independent DC voltage sources $v_{3a}$, $v_{3b}$, $v_{3c}$ insulated from each other may be implemented in various forms. As an example, a simple commercial power source may be insulated using a transformer to make an AC voltage of an appropriate magnitude, and then a DC terminal voltage may be obtained through a rectifying circuit.

Referring to FIG. 3 again, the motor emulator 1000 may further include a filtering unit 300 disposed between the output terminal of the IUT and the voltage following inverter. If the filtering unit 300 is provided between the output terminal of the IUT and the voltage following inverter 100, the output current of the IUT may also be affected by the filtering unit 300. The filtering unit 300 may include at least one of a single-phase inductor, a three-phase inductor and a zero sequence filter, but is not limited thereto. However, since a zero sequence current may flow, the filtering unit 300 preferably includes a zero sequence filter.

Simulation Results

Figure 9A:
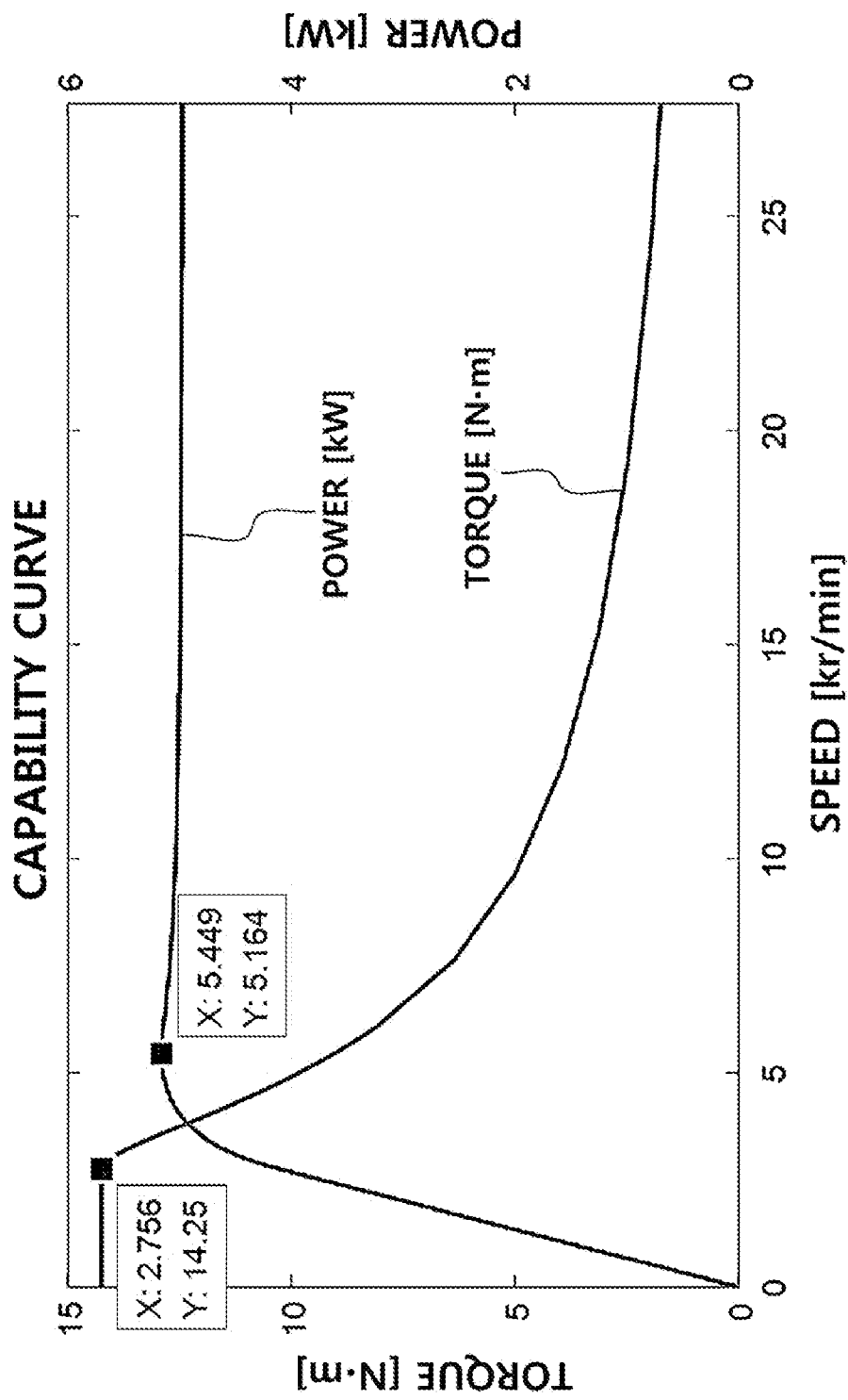
FIGS. 9A and 9B show capability curves of a motor used for emulation.
Figure 9B:
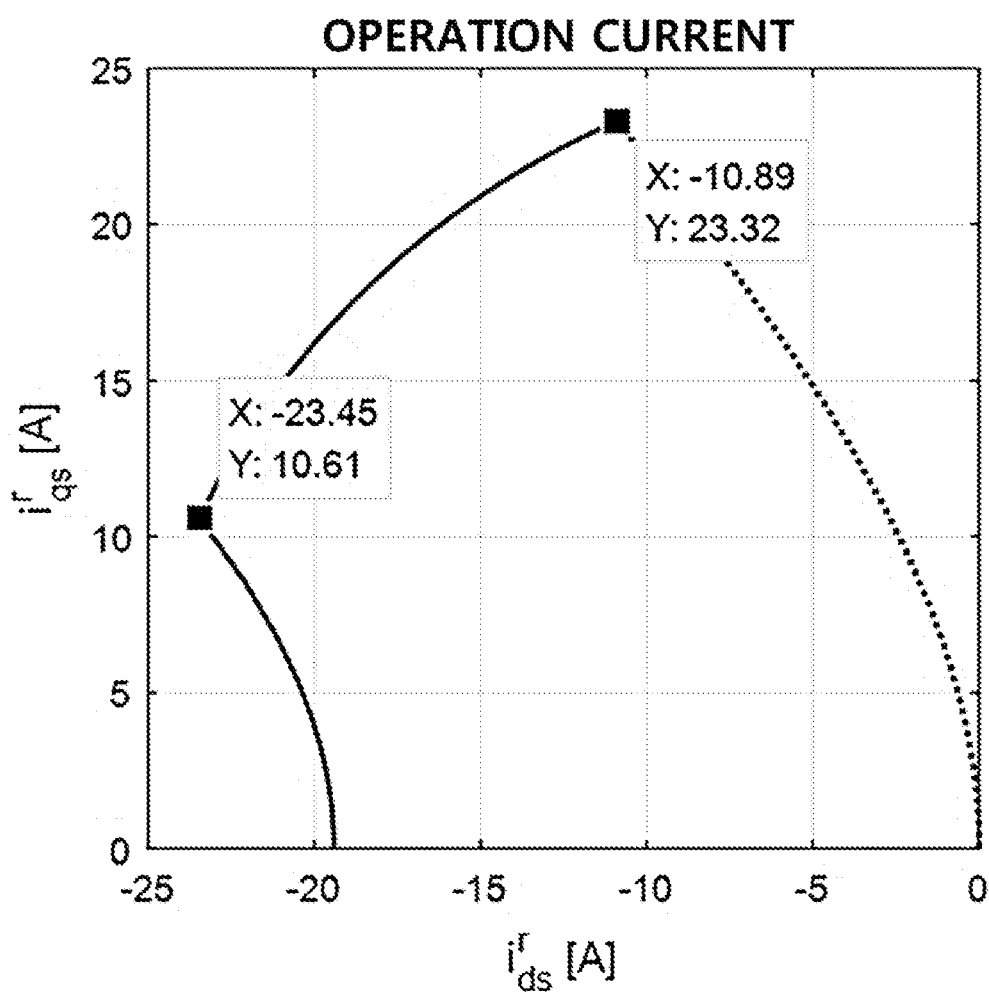

Hardware characteristics of the motor used in this simulation are shown in Table 1 below, and a capability curve and an operation current are shown in FIGS. 9A and 9B. FIGS. 10 to 14 show simulation results of the motor emulator 1000 according to an embodiment of the present disclosure.

In this simulation, the DC terminal voltage was 310 V, the switching frequency of the IUT was selected as 10 kHz, and the inductance of the filter was selected as 82 μH (0.3 pu) under the simulation conditions of the motor emulator 1000, the switching frequency of the motor emulator 1000 was 100 kHz, and double sampling of 200 kHz was applied.

TABLE 1

| Pole/Slot | 8P12S |
|---|---|
| Continuous(Cont.)/Peak Current | 5.2 Arms/15.6 Arms |
| $R_s$ | 0.67 Ω |
| $\lambda_{pm}$ | 82.7 mWb · t |
| $L_{ds}$ | 3.31 mH |
| $L_{qs}$ | 6.15 mH |

Figure 10:
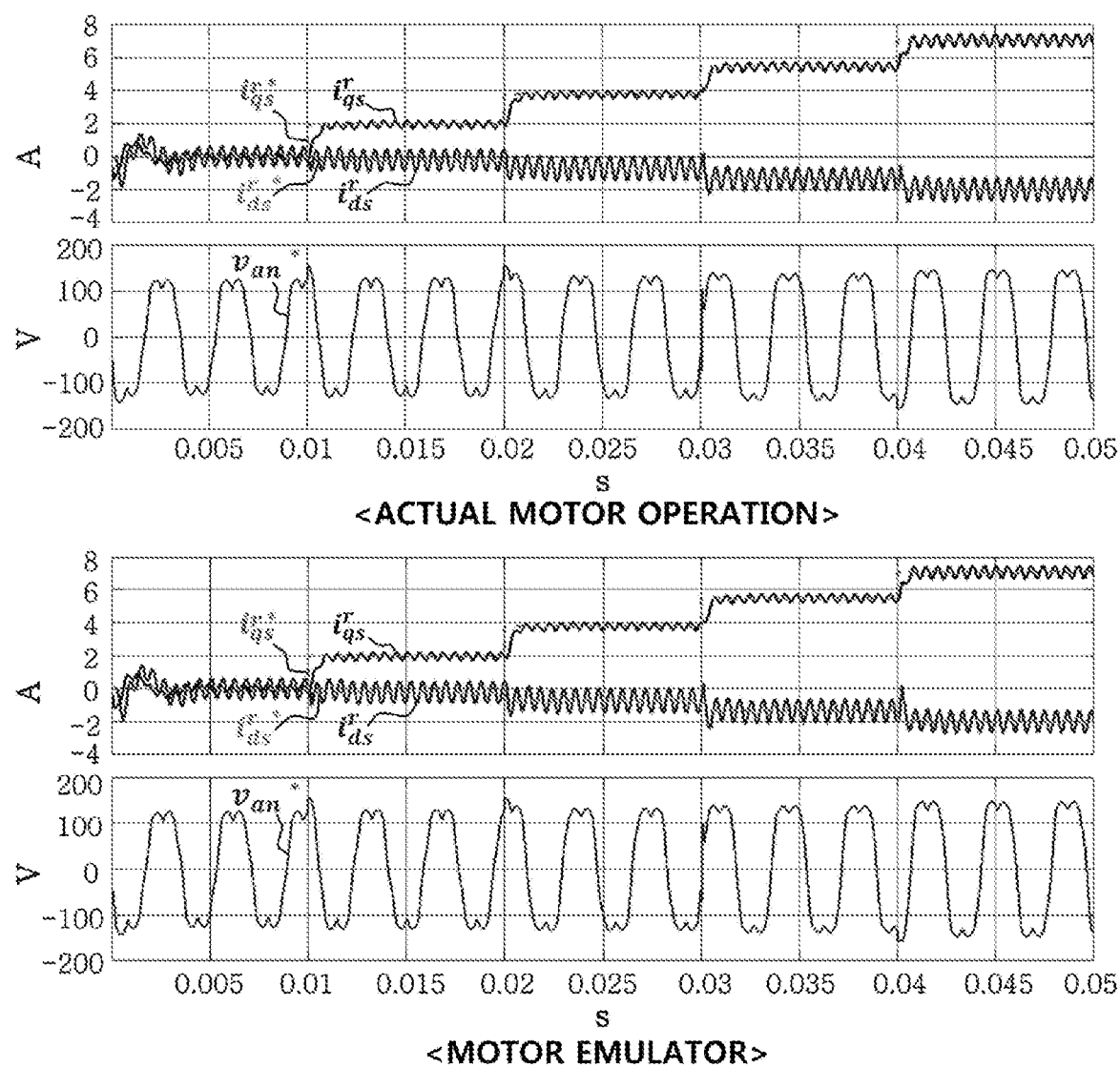
FIGS. 10 to 14 show simulation results of the motor emulator according to an embodiment of the present disclosure.

FIG. 10 is a simulation result of the torque control situation, where the motor speed is 4200 r/min and the torque instruction is sequentially increased to 0, 0.25, 0.5, 0.75, and 1 (p.u.). It may be found that, when the motor emulator of the present disclosure is used, the motor may be accurately emulated so that there is almost no difference from the driving waveform of an actual motor.

Figure 11:
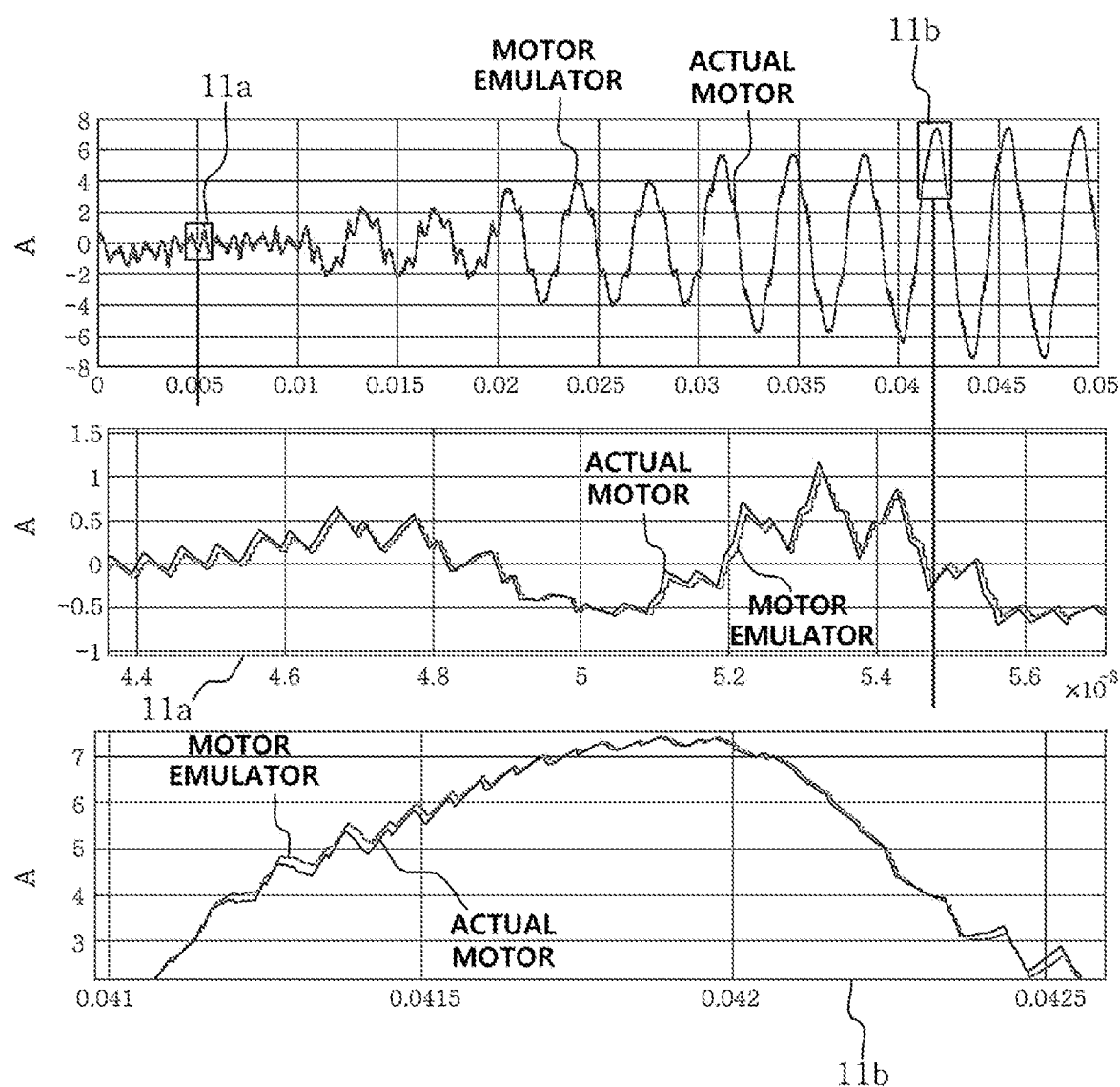

FIG. 11 shows a current when the actual motor and the motor emulator are respectively driven under the conditions of FIG. 10 above. A graph in the middle region is an enlarged view showing a part 11a, and the last graph is an enlarged view showing a part 11b. It may be found that even high-frequency current pulsation is accurately simulated by the motor emulator of the present disclosure.

Figure 12:
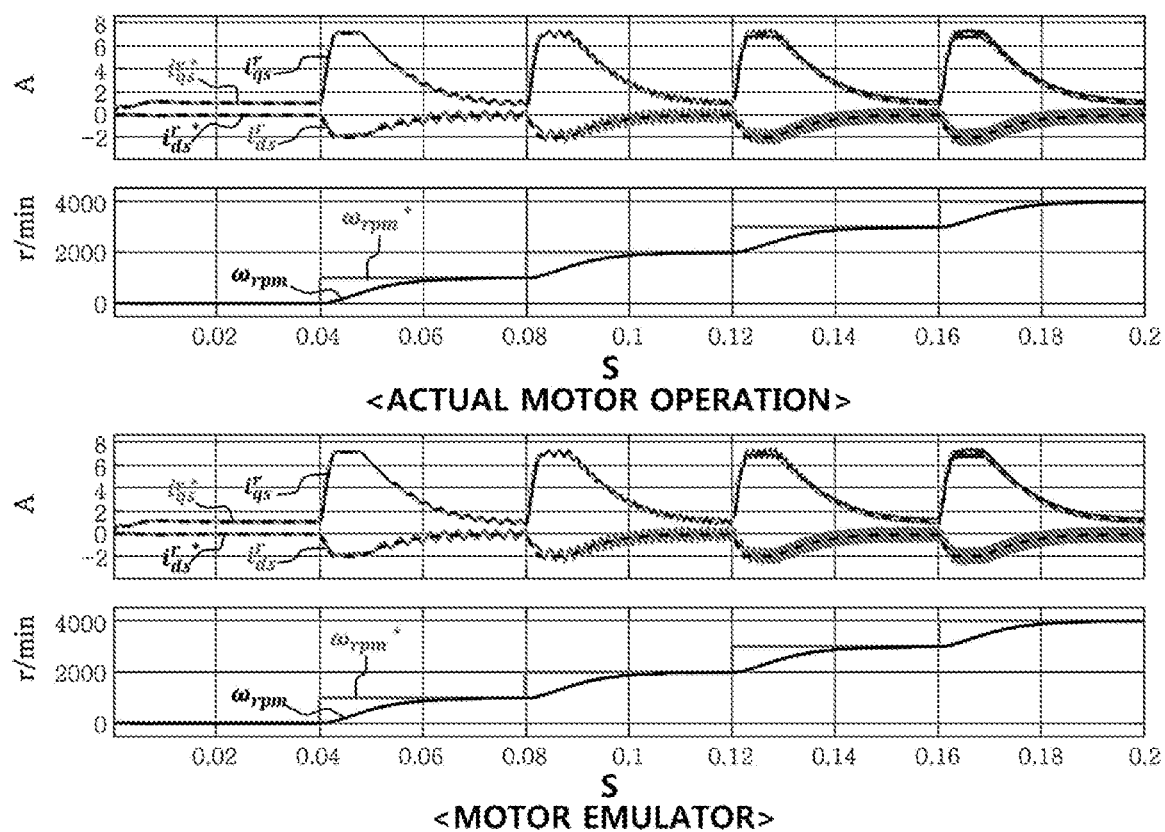

FIG. 12 is a simulation result of a speed control situation, where the load torque is 0.1 p.u. and the speed instruction is sequentially increased to 0, 1000, 2000, 3000, 4000 (r/min). It may be found that even a virtual machine inertia system may be accurately simulated by the motor emulator of the present disclosure.

Figure 13:
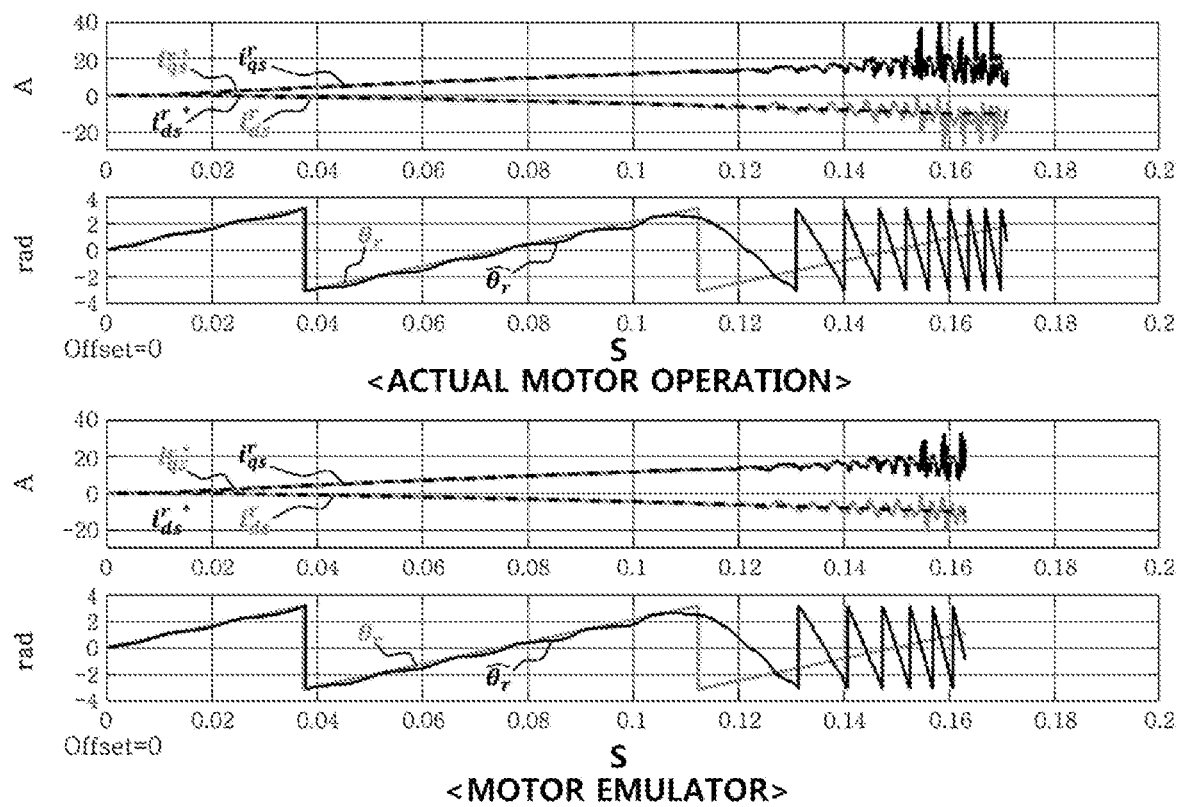

FIG. 13 is a simulation result of a signal-injection sensorless situation, where the motor speed is 200 r/min and the torque instruction is increased from 0 to 3 p.u. at a slew rate of 20 pu/s. It may be found that even the position estimation performance and divergence conditions of each sensorless operation may be accurately emulated by the motor emulator of the present disclosure.

Figure 14:
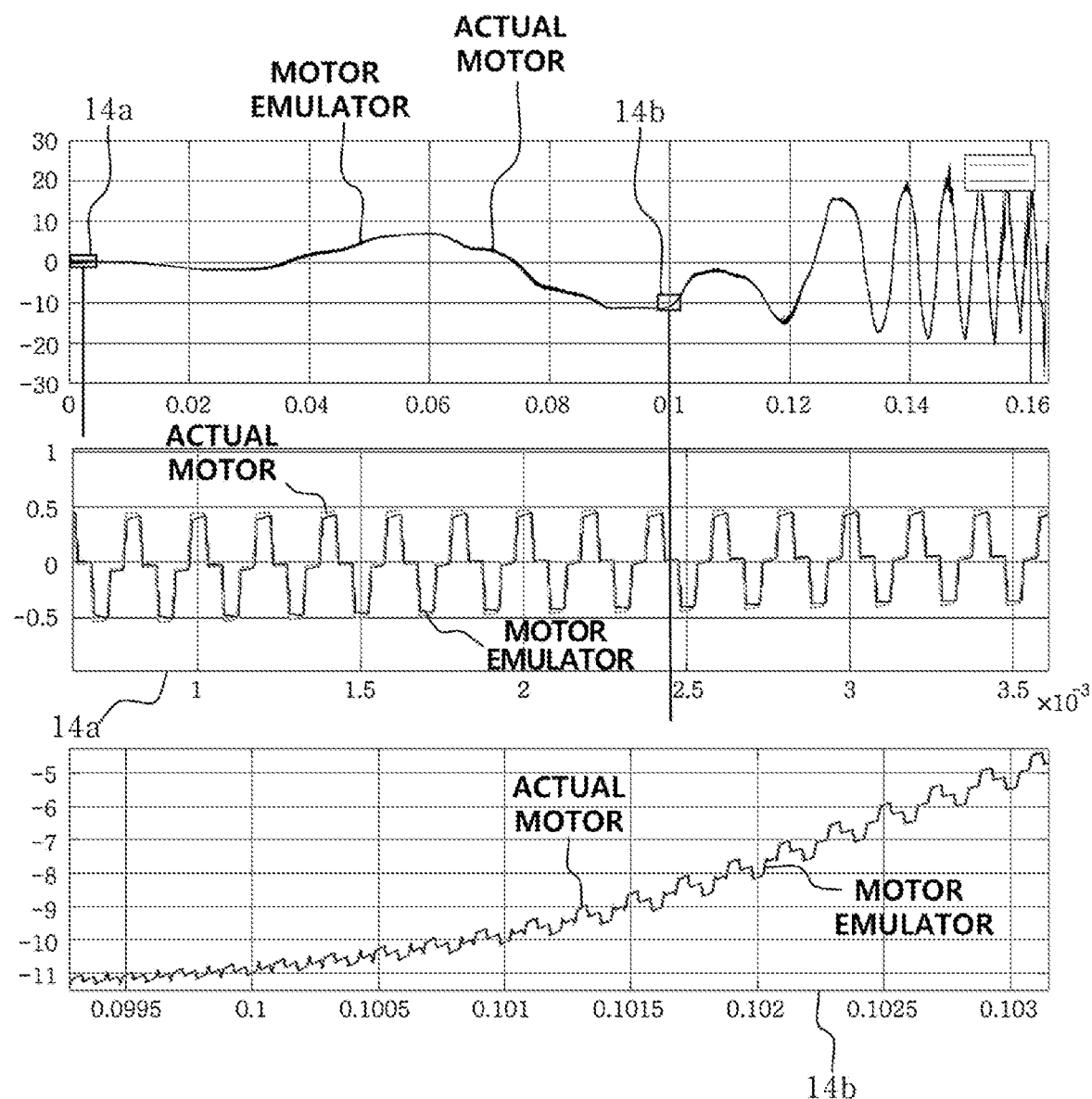

FIG. 14 shows a current when the actual motor and the motor emulator are respectively driven under the conditions of FIG. 13 above. A graph in the middle region is an enlarged view showing a part 14a, and the last graph is an enlarged view showing a part 14b.

The present disclosure has been described based on specific features such as specific components and limited embodiments and drawings, but this is provided just for more comprehensive understanding of the present disclosure, and the present disclosure is not limited to the embodiments, a person skilled in the art may design various changes and modifications from the disclosure.

Therefore, the idea of the present disclosure should not be limited to the embodiments described above, and the appended claims and all modifications equal or equivalent to the claims will fall within the scope of the present disclosure.

REFERENCE SYMBOLS

1000: motor emulator
100: voltage following inverter
110: DC terminal voltage source
120: first switching unit, 121: upper-phase switch, 122: lower-phase switch 130: first switching control unit
200: output current control unit
210: switching circuit
220: second switching control unit
230: independent DC voltage source

The invention claimed is:

1. A motor emulator for an Inverter Under Test (IUT), comprising:
    a voltage following inverter configured to cancel an output voltage of the IUT at least partially; and
    an output current control unit configured to control an output current of the IUT based on the output voltage of the IUT and an estimated current of an emulation target motor,
    wherein the voltage following inverter includes:
        a DC terminal voltage source;
        a first switching unit connected to the DC terminal voltage source in parallel and electrically connected to an output terminal of the IUT; and
        a first switching control unit configured to control switching of the first switching unit based on the output voltage of the IUT and a predetermined threshold voltage.

2. The motor emulator according to claim 1,
    wherein the first switching unit includes an upper-phase switch and a lower-phase switch connected in series, and
    wherein the first switching control unit switches the upper-phase switch and the lower-phase switch by comparing the output voltage of the IUT with the predetermined threshold voltage.

3. The motor emulator according to claim 2,
    wherein the first switching control unit is made of an electronic circuit that receives the output voltage of the IUT and the predetermined threshold voltage.

4. The motor emulator according to claim 1,
    wherein the output current control unit includes:
        a switching circuit electrically connected to an output terminal of the IUT; and
        a second switching control unit configured to estimate a current of the emulation target motor based on the output voltage of the IUT and a characteristic of the emulation target motor and control switching of the switching circuit based on the estimated current.

5. The motor emulator according to claim 4,
    wherein the switching circuit is made of a SiC MOSFET.

6. The motor emulator according to claim 4,
    wherein the switching circuit is made of any one of a full bridge circuit, a half bridge circuit, or a linear power amplifier circuit.

7. The motor emulator according to claim 4,
    wherein the characteristic of the emulation target motor includes at least one of magnetic flux interlinkage, magnetic saturation and spatial harmonics of the emulation target motor.

8. The motor emulator according to claim 4, further comprising:
    independent DC voltage sources configured to each provide a DC voltage to the switching circuit,
    wherein the independent DC voltage sources of different phases are insulated from each other.

9. The motor emulator according to claim 1, further comprising:
    a filtering unit disposed between an output terminal of the IUT and the voltage following inverter,
    wherein the filtering unit includes at least one of a single-phase inductor, a three-phase inductor and a zero sequence filter.

* * * * *